United States Patent
Murakami et al.

(10) Patent No.: US 8,278,558 B2
(45) Date of Patent: Oct. 2, 2012

(54) PRINTED CIRCUIT BOARD AND METHOD OF PRODUCING THE SAME

(75) Inventors: Masashi Murakami, Tokyo (JP); Kazuhito Funae, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 262 days.

(21) Appl. No.: 12/312,918

(22) PCT Filed: Sep. 14, 2007

(86) PCT No.: PCT/JP2007/067964
§ 371 (c)(1),
(2), (4) Date: Jun. 1, 2009

(87) PCT Pub. No.: WO2008/078435
PCT Pub. Date: Jul. 3, 2008

(65) Prior Publication Data
US 2010/0051321 A1 Mar. 4, 2010

(30) Foreign Application Priority Data
Dec. 22, 2006 (JP) .................................. 2006-346229

(51) Int. Cl.
*H05K 1/02* (2006.01)
*H05K 3/10* (2006.01)

(52) U.S. Cl. ............ 174/250; 174/255; 29/825; 29/829; 29/846

(58) Field of Classification Search .................. 174/250, 174/255, 265; 29/825, 829, 846
See application file for complete search history.

(56) References Cited

U.S. PATENT DOCUMENTS

| 3,567,844 | A | * | 3/1971 | Krcmar | 174/268 |
| 4,851,614 | A | * | 7/1989 | Duncan, Jr. | 174/263 |
| 5,237,132 | A | * | 8/1993 | Takahashi | 174/262 |
| 5,295,299 | A | * | 3/1994 | Takahashi | 29/853 |
| 5,346,401 | A | * | 9/1994 | Delianides et al. | 439/67 |
| 6,344,609 | B1 | * | 2/2002 | Nakano | 174/351 |
| 6,674,015 | B2 | * | 1/2004 | Aoki | 174/255 |
| 7,046,497 | B1 | * | 5/2006 | Bonin | 361/290 |
| 7,126,061 | B2 | * | 10/2006 | Lin | 174/260 |
| 7,399,399 | B2 | * | 7/2008 | Chou et al. | 205/126 |
| 2008/0023221 | A1 | * | 1/2008 | Hsu et al. | 174/262 |

FOREIGN PATENT DOCUMENTS

| JP | 60-263492 A | | 12/1985 |
| JP | 62-94296 A | | 4/1987 |
| JP | 1-93758 U | | 6/1989 |
| JP | 01-093758 U | * | 6/1989 |
| JP | 4-210397 A | | 7/1992 |
| JP | 10313157 A | * | 11/1998 |
| JP | 2002-52494 A | | 2/2002 |
| JP | 2005-116908 A | | 4/2005 |
| JP | 2008034568 A | * | 2/2008 |

OTHER PUBLICATIONS

English machine translation of Koizumi et al. Japanese patent No. JP2005-116908, Apr. 28, 2005, translated on Jul. 13, 2011.*

* cited by examiner

*Primary Examiner* — Robert J Hoffberg
(74) *Attorney, Agent, or Firm* — Birch, Stewart, Kolasch & Birch, LLP

(57) ABSTRACT

The portion of a board corresponding to the surrounding portion of a hole 4 formed through the board is arranged to include a patternless section 6 where a conductive film 5 is not provided.

8 Claims, 4 Drawing Sheets (A)

(B)

(A)

(B)

(A)

(B)

PRINTED CIRCUIT BOARD AND METHOD OF PRODUCING THE SAME

TECHNICAL FIELD

The present invention relates to a printed circuit board and a method of producing the board.

BACKGROUND ART

A printed circuit board is provided with holes for mounting a component as required. The leads of a component are each inserted through one of the holes, and the lead is soldered to a land around the hole. Punching a circuit board with a die is executed as a method of forming such holes.

However, since the diameter of a hole has been designed so as to be equal to the inner diameter of a land, when a circuit board is punched out with a die press in a circuit board manufacturing process, the following situation may occur: a wiring pattern formed on the substrate thereof by etching or the like after producing of a material board can peel easily to leave a burr thereon. If a burr is left thereon, the printed circuit board becomes a defective piece, thus reducing yields thereof. If a circuit board where a burr is left thereon is used as it is, the board can cause a short circuit when the burr downward falls. Further, produced printed circuit boards are stacked when they are transported, and thus a board where a burr is left can also damage another board. Technologies of preventing a burr from being left on a circuit board when holes are punched out in the board include those disclosed in the following Patent Documents 1 and 2, for instance.

Patent Document 1: JP-A-2002-052494
Patent Document 2: JP-A-1987-094296

The technology of preventing a burr from being left thereon disclosed in Patent Document 1 punches out holes in a circuit board through a sheet and requires the additional preparation of the sheet. Moreover, the technology requires that the sheet-be processed. Furthermore, the technology disclosed in Patent Document 2 punches holes by providing isolated lands on the side of a board opposite lands used in the circuit board, and requires that such isolated lands be anew provided thereon.

The present invention has been accomplished to solve such a technical situation, and an object thereof is to prevent a burr from being left on a printed circuit board when holes are punched out in the board, in a simpler structure and by a simpler method.

DISCLOSURE OF THE INVENTION

A printed circuit board according to the present invention is arranged such that a conductive film is not provided over the portion of a substrate corresponding to the surrounding portion of a hole to be formed through the substrate, or the portion of a substrate corresponding to the corner area of a hole having a corner to be formed therethrough.

Further, a method of producing a printed circuit board according to the present invention is arranged such that a conductive film is not provided over the portion of a substrate corresponding to the surrounding portion of a hole to be formed through the substrate, or the portions of a substrate corresponding to the corner areas of a rectangular hole to be formed therethrough.

According to the printed circuit board according to the present invention, it is arranged that conductive film be not provided over a place where a burr tends to be left, and thus a burr is not left on the fringe of a hole when the board is subjected to a punching process. Further, according to the method of producing a printed circuit board in accordance with the present invention, a board where a burr is not left even when the board is subjected to a punching process can be obtained. Previously applying the present invention to a pattern on a substrate at the designing state thereof eliminates the necessity of any irregular procedures and equipment for preventing a burr from being left thereon when the circuit board is produced.

BEST MODE FOR CARRYING OUT THE INVENTION

Embodiments of the present invention will now be described with reference to the accompanying drawings in order to explain the present invention in more detail.

First Embodiment

Figure 1:
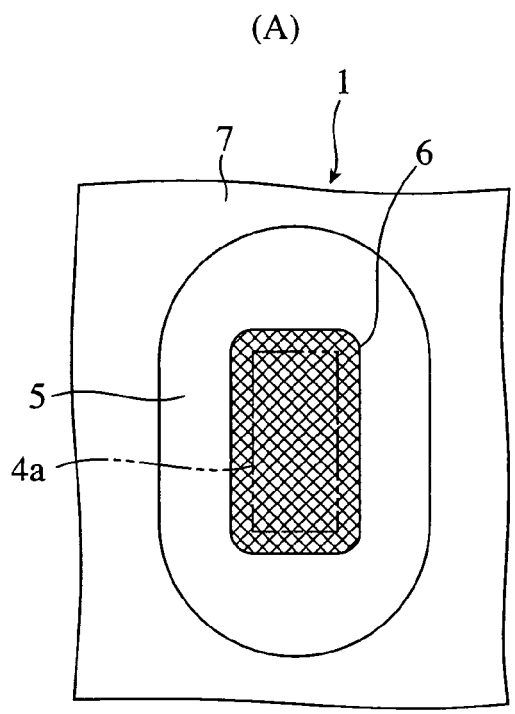
FIG. 1(A) is a fragmentary plan view of a printed circuit board according to the first embodiment of the present invention.
FIG. 1(B) is a fragmentary plan view of the board after completion of a hole-forming process.
Figure 1:
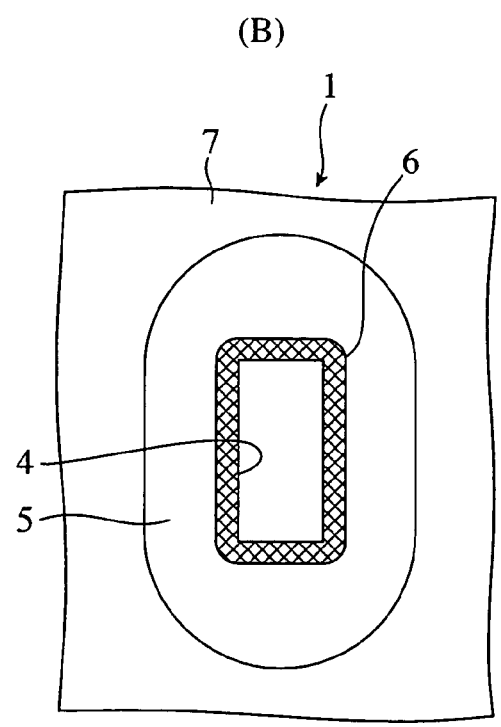
Figure 2:
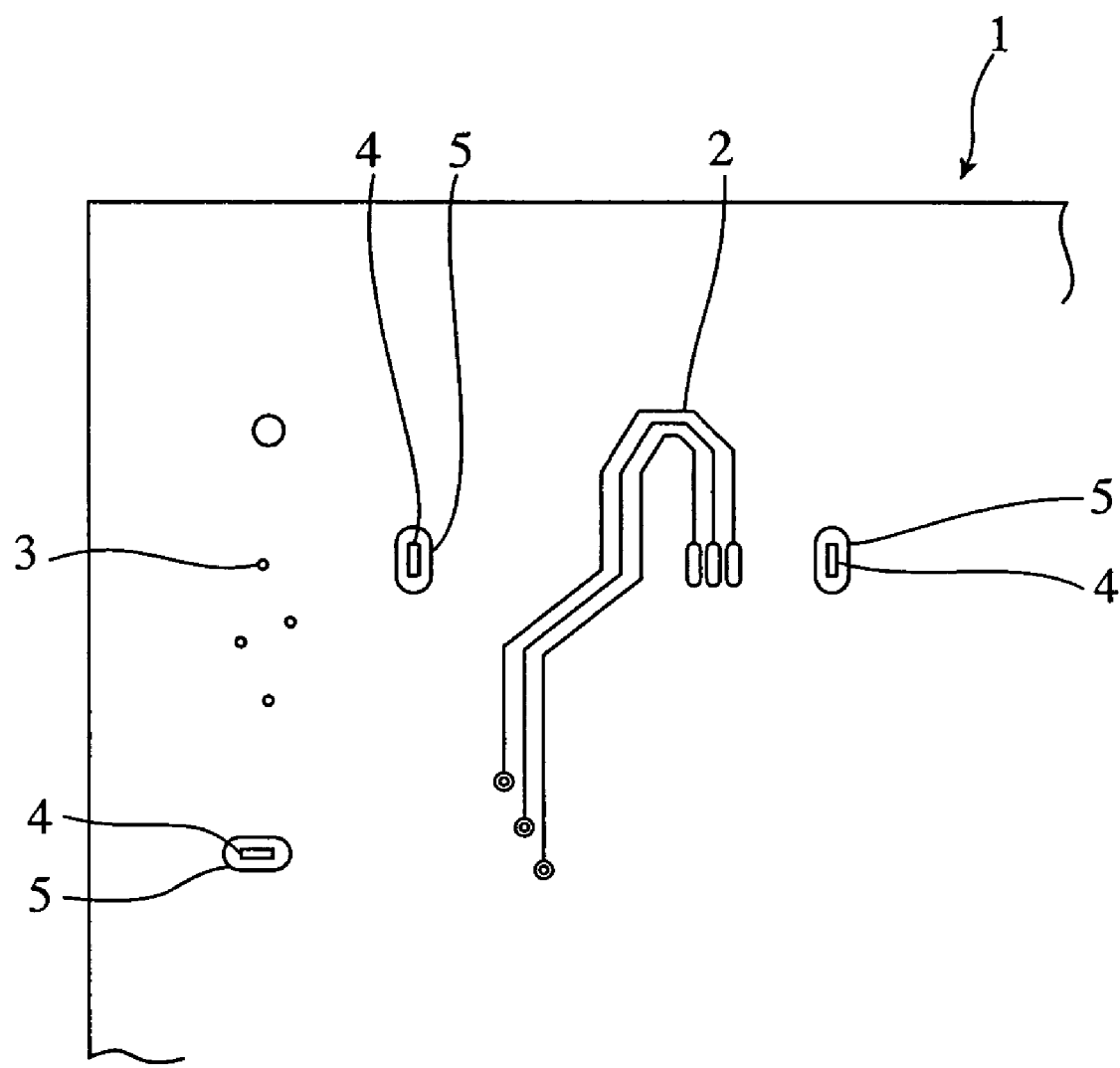
FIG. 2 is a fragmentary plan view of an example of the printed circuit board.

FIG. 1(A) shows a fragmentary plan view of a hole-forming portion of a printed circuit board according to the first embodiment of the present invention, and FIG. 1(B) shows a fragmentary plan view of the board after completion of a hole-forming process. FIG. 2 shows a fragmentary plan view of the printed circuit board by way of example.

As shown in FIG. 2, formed through a printed circuit board 1 are formed non-conductive holes 4 for mounting a component and having corners, in addition to wirings 2 and through holes 3. The holes having corners include a hole having a curved portion or edge on one end side thereof and corners on the other end side and a hole shaped like a cross, in addition to a rectangular hole shown in the figure by way of example. An explanation will be given by referring to a hole having a corner simply as a "hole" hereinafter. In the place of the board 1 where a hole 4 is to be formed, as shown in FIG. 1(A), a patternless section 6 without a cupper foil is formed in the central portion of a land (wiring pattern) 5 formed of a cupper foil as a conductive film. In this context, a portion surrounding the land 5 is covered with coating in FIG. 1(A). The patternless section 6 is formed so as to be larger than the outline 4a (shown by the chain double-dashed line in the figure) of the hole 4 to be formed. Therefore, when in the section, the board is subjected to a hole-forming process with a die press, the hole 4 formed therethrough does not have any land 5 on the fringe thereof, and thus any burr is not left on the fringe of the hole as shown in FIG. 1(B).

The manufacturing of a board having the hole-forming portion as shown in FIG. 1(A) will now be discussed. When the board is produced from, for example, a substrate coated with a copper foil over the surface thereof, the area corresponding to the patternless section 6 is not masked and the copper foil is removed from the area by etching. For another method thereof, the following is considered: the area corresponding to the patternless section 6 is removed from the substrate coated with a copper foil over the surface thereof by a mechanical method such as cutting. Also in other methods thereof, the board is manufactured by providing no copper foil over the area corresponding to the patternless section or removing the copper foil from the area.

According to the printed circuit board according to the first embodiment, the hole 4 is formed within the patternless section 6, and thus there is not any pattern, that is, any copper foil around the hole 4, which does not cause the copper foil to peel and a burr to remain thereon. An inconvenience such as damage of the circuit board to be caused due to the occurrence of burrs is to be solved. Further, according to the method of producing the board, a board can be obtained, through which the hole 4 having no pattern therearound can be punched.

Second Embodiment

Figure 3:
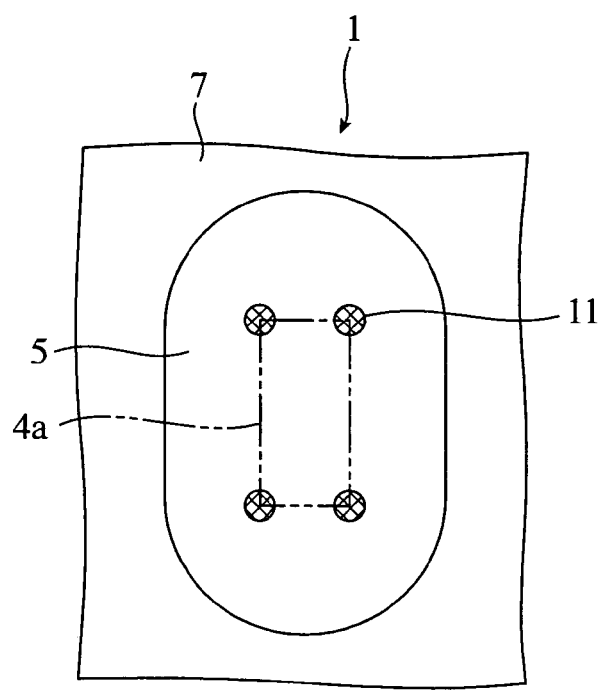
FIG. 3(A) is a fragmentary plan view of a printed circuit board according to the second embodiment of the present invention.
FIG. 3(B) is a fragmentary plan view of the board after completion of a hole-forming process.
Figure 3:
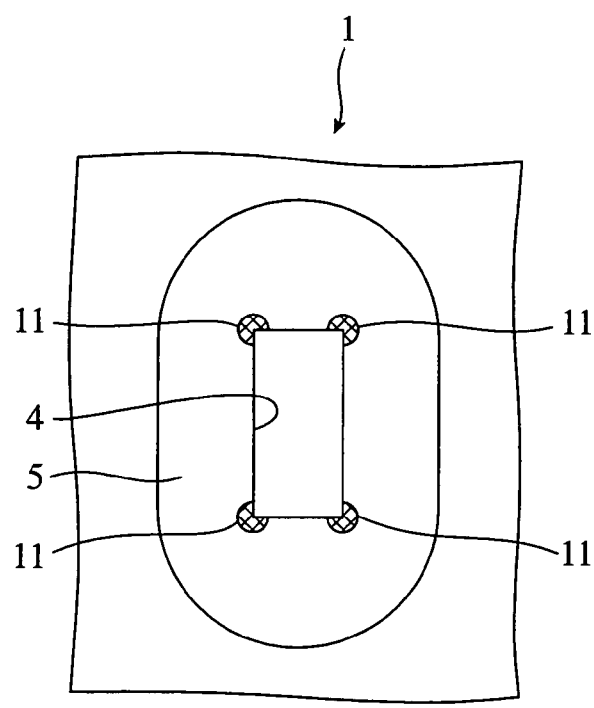

FIG. 3(A) shows a fragmentary plan view of a printed circuit board according to the second embodiment, and FIG. 3(B) shows a fragmentary plan view of the board after completion of a hole-forming process.

In the place of a board 1 where a hole 4 is to be formed, four areas corresponding to the corner areas of the hole 4 within a land (wiring pattern) 5 formed of copper foil are each provided with a circular patternless section 11 having no copper foil. The patternless section 11 is located in each of the corner areas of the outline 4a (shown by the chain double-dashed line in the figure) of the hole 4 to be formed. Therefore, when in the sections, the board is subjected to a hole-forming process by punching using a die press or the like, the hole 4 formed therethrough does not have any land 5, that is, any copper foil portion in each of its corner areas as shown in FIG. 3(B), and thus any burr is not left in the corner areas of the hole 4.

In the manufacturing of a board having the hole-forming portion shown in FIG. 3(A), when the board is produced from, for example, a substrate coated with a copper foil over the surface thereof, the areas corresponding to the patternless sections 11 are not masked and the copper foil is removed from those areas by etching. For another method thereof, the following is considered: the areas corresponding to the patternless sections 11 are mechanically removed from a substrate coated with a copper foil over the surface thereof by cutting. Also in other methods thereof, the board is manufactured by providing no copper foil over the areas corresponding to the patternless sections 11 or removing the copper foil from those areas.

According to the printed circuit board in accordance with the second embodiment, each of the corner areas of the hole 4 is formed within each of the patternless sections 11, and thus each of the corner areas of the hole 4 does not have any pattern, that is, any copper foil. Thus, the copper foil does not peel, and no burr is left thereon. A burr tends to be left in the corner area; however, thus previously providing the patternless section 11 in the corner area can effectively prevent a burr from being left thereon. Further, according to the method of producing the board, the board through which the hole 4 having no pattern in the corner areas can be punched can be obtained. In a component mounting process, a lead of a mounting component such as an electronic part or a metal sheet is inserted through the hole 4, and the lead is soldered to the land 5 around the hole 4 (by flow soldering, manual soldering, or the equivalent). At that time, the hole 4 has the land 5 on the fringe thereof, and thus the contact area between the lead of the mounting component inserted through the hole 4 and the land 5 can be secured, which prevents the occurrence of faulty soldering such as solder non-wetting or the like. Therefore, a yield in board manufacturing is enhanced, and an inconvenience such as the damage of a board or the like caused by a burr is solved.

Third Embodiment

Figure 4:
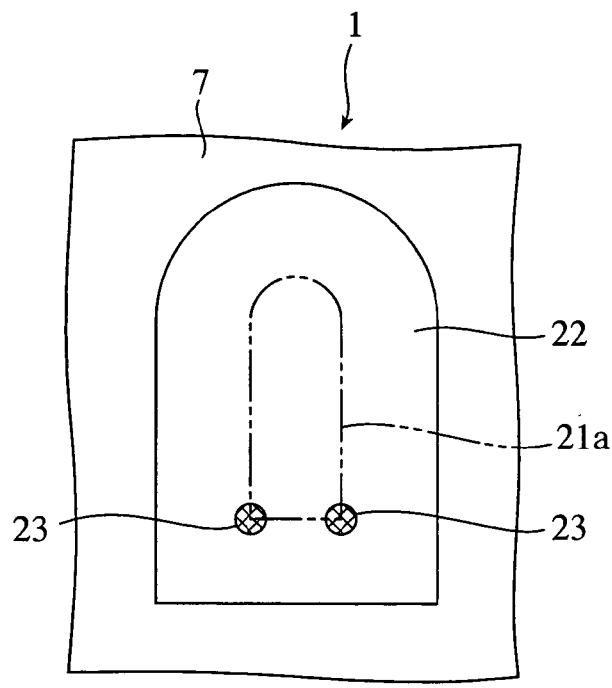
FIG. 4(A) is a fragmentary plan view of a printed circuit board according to the third embodiment of the present invention.
FIG. 4(B) is a fragmentary plan view of the board having been subjected to a hole-forming process. Those are schematic views showing examples of the resist-uncoated portion thereof.
Figure 4:
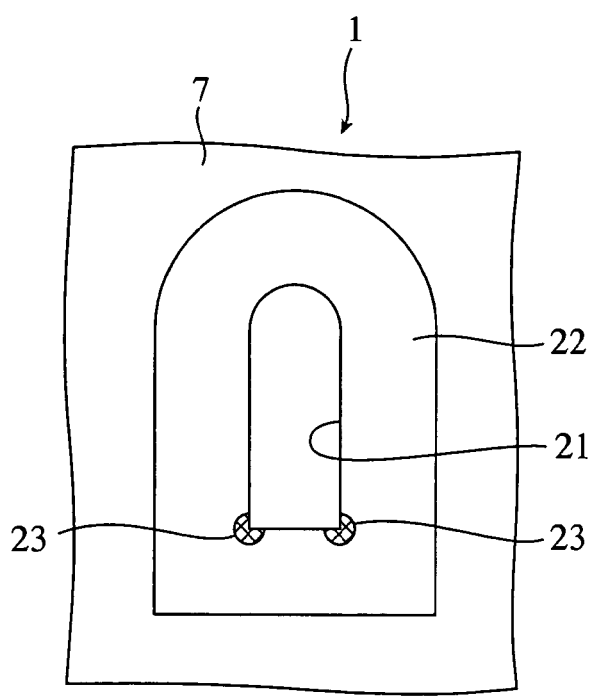

FIG. 4(A) shows a fragmentary plan view of a printed circuit board according to the third embodiment, and FIG. 4(B) shows a fragmentary plan view of the board after completion of a hole-forming process. The third embodiment is applied to a hole 21, which is not rectangular, has a corner area in some places, and has a curved edge or portion in other places.

As shown in FIG. 4(A), in the place of a board 1 where the hole 21 is to be formed, the areas corresponding to the two corner areas of the hole 21 are each provided with a patternless section 23 that is circular and does not have a copper foil. The patternless section 23 is located in each of the corner areas of the outline 21a (shown by the chain double-dashed line in the figure) of a hole to be formed. For this reason, when in the sections, the board is subjected to a punching process with a die press or the like, the hole 21 formed therethrough does not have any land 22, that is, any copper foil in each of the two corner areas thereof, and thus no burr can be left in the corner areas of the hole 21.

In manufacturing a board having the hole-forming portion shown in FIG. 4(A), when the board is produced from, for instance, a substrate coated with a copper foil over the surface thereof, the area corresponding to the patternless section 23 is not masked and the copper foil is removed from the area by etching. For another method thereof, the following method is considered: the area corresponding to the patternless section 23 is mechanically removed from a substrate coated with a copper foil over the surface thereof by cutting. Also in other methods thereof, the board is manufactured by providing no copper foil over the area corresponding to the patternless section 23 or removing copper foil from the area.

According to the printed circuit board in accordance with the third embodiment, the corner area of the hole 21 is formed within the patternless section 23, and thus the corner area of the hole 21 does not have any pattern, that is, any copper foil. Thus, the copper foil does not peel, and no burr is left thereon. A burr tends to be left in the corner area of a hole; however, thus previously providing the patternless section 23 in the corner area can effectively prevent a burr from being left thereon. Moreover, according to the method of producing the board, the board can be obtained, through which the hole 21 having no pattern in the corner area thereof can be punched.

Industrial Applicability

As mentioned hereinabove, the printed circuit board and the method of producing the board according to the present invention are suitable, for example, for a printed circuit board that is subjected to a punching process and a method of producing the board, respectively, because the printed circuit board and the method thereof according to the invention are a printed circuit board such that no burr is left when the board is subjected to a punching process with a die and the method of producing the board, respectively, by arranging the board such that conductive film is not provided over an area where a burr tends to be left.

The invention claimed is:

1. A printed circuit board, comprising:
   a substrate equipped with a hole, said hole having a continuous outline, said continuous outline including a corner; and
   a conductive film disposed on the substrate, said conductive film being disposed on the substrate such that an inner periphery of said conductive film is coincident with said continuous outline except at an area surrounding the corner;
   the substrate including a portion having no conductive film, defining a patternless section, said patternless section being formed at the area surrounding the corner,
   wherein a portion of a periphery of said patternless section is coincident with said continuous outline and
   wherein said inner periphery of the conductive film is coincident with an outer periphery of the patternless section.

2. The printed circuit board of claim 1, wherein the conductive film is a wiring land.

3. The printed circuit board of claim 1, wherein the corner is one of two or more corners.

4. The printed circuit board of claim 1, wherein the continuous outline of the hole includes a curved edge.

5. A method of producing a printed circuit board having a substrate with a conductive film disposed thereon, where the substrate is to be equipped with a hole, said hole having a continuous outline, said continuous outline including a corner, the method comprising:
   providing a substrate portion having no conductive film by defining a patternless section in a portion of the conductive film at an area surrounding the corner before equipping the substrate with the hole,
   equipping the substrate with the hole, said equipping including forming the hole such that
      said patternless section is on an outside of said continuous outline of said hole,
      an inner periphery of the conductive film is coincident with said continuous outline except at the patternless section; and
      an inner periphery of the conductive film is coincident with an outer periphery of the patternless section.

6. The method of claim 5, wherein the conductive film is a wiring land.

7. The method of claim 5, wherein the corner is one of two or more corners.

8. The method of claim 5, wherein the continuous outline of the hole includes a curved edge.

* * * * *